LOGARITHMIC SIGNAL COMPRESSOR

Filed Nov. 5, 1965 2 Sheets-Sheet 1

INVENTOR
JACK R. HARFORD

BY Browne, Schuyler & Beveridge
ATTORNEYS

AA REPRESENTS A SMALL SIGNAL
BB REPRESENTS A LARGER SIGNAL

INVENTOR
JACK R. HARFORD

BY Browne, Schuyler & Beveridge
ATTORNEYS

United States Patent Office 3,479,525

Patented Nov. 18, 1969

3,479,525

LOGARITHMIC SIGNAL COMPRESSOR

Jack R. Harford, Boonton, N.J., assignor to Aircraft Radio Corporation, Boonton, N.J., a corporation of New Jersey

Filed Nov. 5, 1965, Ser. No. 506,464

Int. Cl. H03k *5/20*

U.S. Cl. 307—235 8 Claims

ABSTRACT OF THE DISCLOSURE

A logarithmic signal compressor circuit featuring a negative resistance tunnel diode biased by the differential direct current voltages between emitters of a pair of transistor amplifiers to its negative resistance region. The tunnel diode acts as a non-linear load on the collector of the first transistor stage. Sufficient parallel resistance or impedance is connected across the tunnel diode to balance the negative resistance for the alternating current signal and a tuned circuit is also connected across the diode to eliminate the effect of stray circuit reactances and parasitic oscillations. Consult the specification for other features and details.

The present invention relates to a logarithmic signal compressor circuit and, more particularly, to a logarithmic amplifier utilizing negative resistance diodes such as tunnel diodes.

There is known in the prior art various arrangements in amplifier circuits responsive to amplitude of input signal for effecting a logarthmic or linear attenuation of input signal. For example, circuits known as AGC diode attenuators, cascaded saturation amplifiers (tube and transistor types) and non-linear amplifiers as well as circuits for producing a linear output from a logarthmic signal (e.g., antilogarithmic circuitry).

The present invention is a logarthmic compressor circuit of the type utilizing a negative resistance device such as a tunnel diode or other negative resistance semiconductor device. The signal compressor of the present invention maintains relative amplitude integrity of input signals, exhibiting an increasing signal compression with increasing signal and vice versa and is not limited in frequency or bandwidth (except by the characteristic of the negative resistance tunnel diode) and the response is instanteously obtained so that the output signal has nearly symmetrical characteristics and requires no feedback to shape the response.

The invention features a tunnel diode biased by direct current voltage to its negative resistance region of operation from emitter direct current potentials of a pair of cascaded transistor amplifiers so that the tunnel diode is thus biased from a constant voltage low impedance source. Sufficient parallel resistance or impedance is connected across the diode to offset the negative resistance for the alternating current signal and a tuned circuit is also connected across the diode to eliminate the effect of stray circuit reactances and prevent parasitic oscillations. In any event, the average direct current voltage across the tunnel diode is not varied and due to the recited biasing conditions, the circuit has temperature stability.

The foregoing and other features and advantages of the invention will become apparent from the following specification when considered within the drawings wherein.

Figure 1:
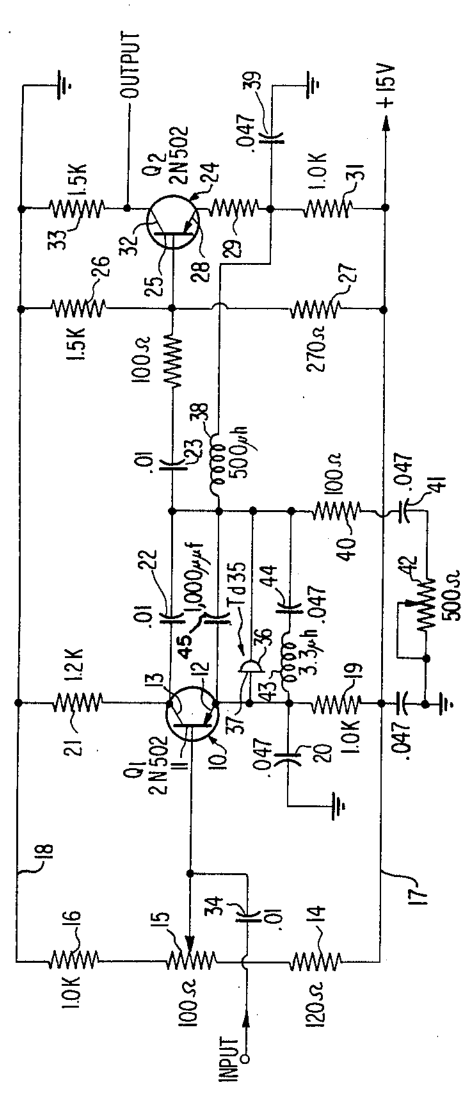
FIG. 1 is a logarithmic compressor circuit incorporat ing the invention.

With reference to FIG. 1, PNP transistor 10 having base 11, emitter 12 and collector 13, is connected as a common emitter amplifier. Base 11 is biased by a voltage divider comprising resistor 14, potentiometer 15, and resistor 16, which voltage divider is connected between the positive bus 17 and ground bus 18. Emitter 12 is connected to the positive bus 17 through emitter resistor 19 which is bypassed by bypass capacitor 20 so that the emitter is at alternating current ground potential. Collector 13 is connected through collector load resistor 21 to ground bus 18 and the output of transistor 10 is coupled through a pair of series connected capacitors 22 and 23 to base 25 of transistor 24. Base 25 of transistor 24 is biased from a voltage divider comprising resistors 26 and 27 connected between positive bus 17 and ground bus 18. Emitter 28 of transistor 24 is connected through small resistor 29 and large resistor 31 to positive bus 17 while collector 32 is connected through its load resistor 33 to the ground bus 18.

As thus described, transistors 10 and 24 are connected in a conventional two-stage amplifier circuit with the input being coupled through coupling capacitor 34 to the base of transistor 11 and the circuit would operate in normal two-stage amplifier fashion with the separate stages being R–C coupled.

In accordance with the invention, tunnel diode 35 having cathode 36 and anode 37 is connected between emitters 12 and 28 of transistors 10 and 24, respectively, so that these transistors, with respect to tunnel diode 35 serve as low impedance voltage sources for biasing the tunnel diode 35 to an intermediate point on its negative conductance or resistance portion of its negative conductance or resistance portion of its characteristic curve. Cathode 36 of tunnel diode 35 is direct current connected through R–F choke 38 to a common point between emitter resistors 29 and 31. Capacitor 39 places the common point between resistors 29 and 31 at alternating current ground potential (resistor 33 has a low resistance value (33 ohms) and may be omitted where biasing currents of the emitters are unequal). Cathode 36 of tunnel diode 35 is also directly connected to a point intermediate coupling capacitors 22 and 23, which coupling capacitors serve as direct current blocking capacitors for the tunnel diode 35. Thus, the direct current bias voltages for the tunnel diode 35 comprise the differential voltage between emitter 12 and the common point between emitter resistors 29 and 31 of transistor 24. In connection with alternating current signals, the cathode 36 of tunnel diode 35 is connected through capacitor 22 to the collector 13 of transistor 10 so that the tunnel diode appears as a non-linear load on collector 13 of transistor 10.

Adjustment of the position of the contact on potentiometer 15 adjusts the direct current flow through emitter resistor 19 to provide an adjustable control over the point of operation of the tunnel diode 35 along its negative resistance curve. Inasmuch as tunnel diode 35 is biased from the emitter voltages of transistors 10 and 24, and since these are like transistors, changes in ambient temperature do not effect operation of the circuit since the emitter voltages of transistors 10 and 24 will tend to change in the same direction, thus cancelling any changes in the bias potential across tunnel diode 35 due to such changes.

Figure 3:
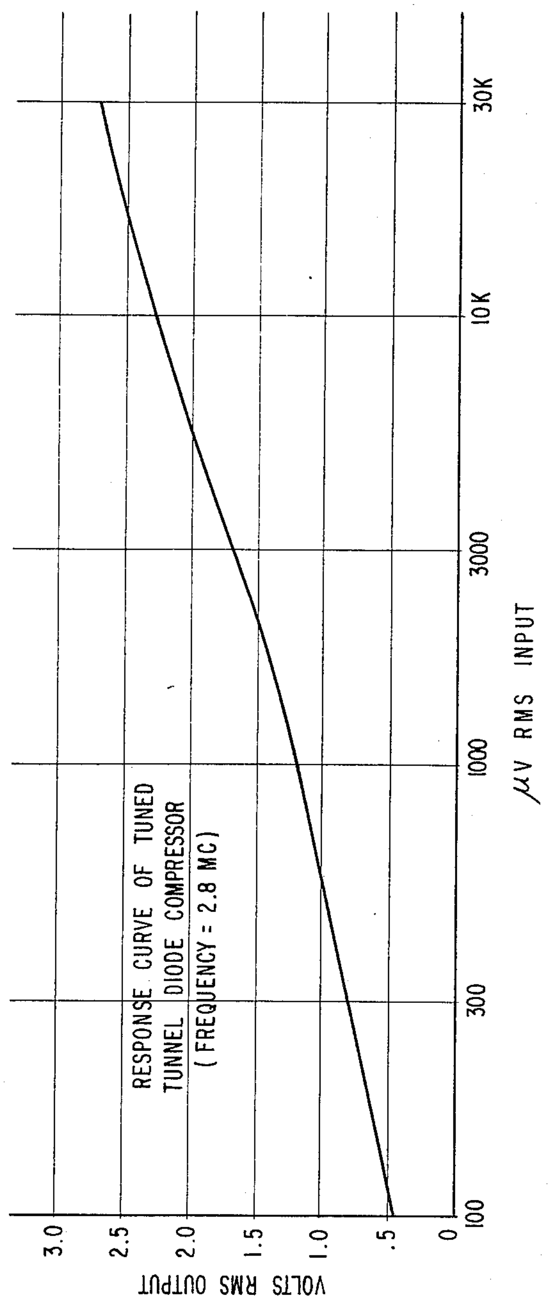
FIG. 3 is a curve showing the logarithmic signal compression of the circuit shown in FIG. 1.
Figure 2:
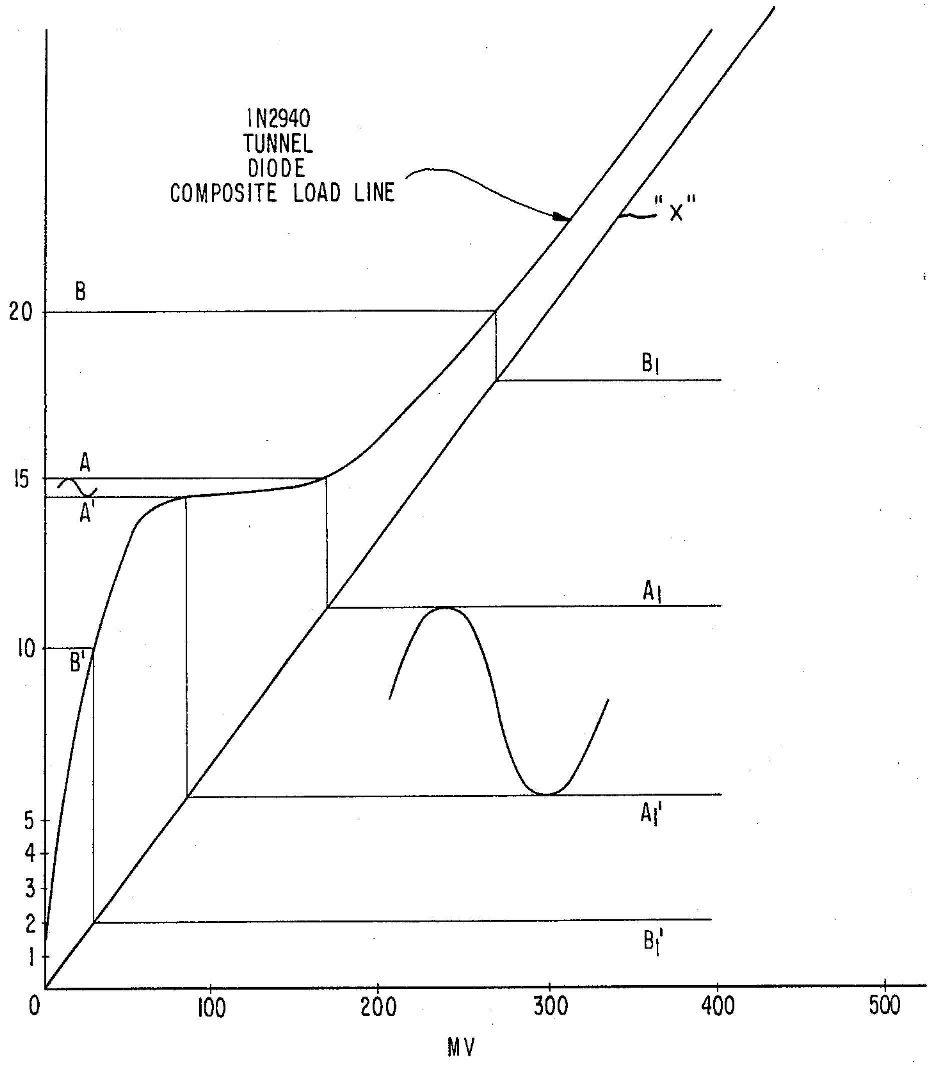
FIG. 2 is a diagram illustrating the operating characteristics of the tunnel diode in accordance with the invention.

The active circuit comprises transistor 10 and the tunnel diode 36 acting as a non-linear load on the collector 13 thereof. Transistor 24 compresses the signal somewhat at higher levels, but its primary purpose in the circuit of FIG. 1 is as a biasing element for tunnel diode 35. The compression at higher levels is due to the poor large signal capability of transistor 10 and transistor 24. The primary frequency limitation of the circuit is the transistor input and output impedances. However, it should be clear that the circuit can accommodate pulse signals by making the coupling and decoupling capacitors in the circuit appropriate. Insofar as signal currents are concerned, tunnel diode 35 is operated in the parallel amplifier configuration and is a signal level responsive load on transistor 10. In addition, parasitic oscillation circuit comprising resistor 40, capacitor 41 and variable resistance 42 aid in avoiding undesirable oscillations by offsetting the negative resistance of tunnel diode 35 (the horizontal portion of the composite load line shown in FIG. 2). To the same end, inductor 43 and its series capacitor 44, and capacitor 45 in parallel with tunnel diode 35 are utilized to tune out stray inductances and capacitances. FIG. 3 shows the logarithmic response to the circuit of FIG. 1. The component values shown on FIG. 1 are merely exemplary. In FIG. 2, the slope of the curve labeled "IN2940 Tunnel Diode Composite Load Line" represents the shunt signal impedance which is seen by the alternating current signal. (The composite load line is the algebraic sum of the diode conductance characteristic (not shown) and positive circuit conductance represented by curve X.) A nearly horizontal slope is a high shunt impedance like that shown for a small signal AA' and little compression is involved here. Large signals BB' extends to the more vertical (greater slope) parts of the composite load line where the shunt impedance appears low and the desired logarithmic compression occurs.

While a separate direct bias source may be used to bias tunnel diode 35 to its negative resistance region, it is important that the dynamic impedance of the tunnel diode circuit be instantaneously responsive to the changes in signal strength and without any feedback potential being applied thereto.

While the invention has been described in accordance with the patent statutes in connection with the preferred embodiments thereof, it is to be understood that modifications may be made by those skilled in the art without departing from the scope of the invention as set forth in the following claims.

What is claimed is:

1. A logarithmic amplitude compressor comprising, a three stage amplifier wherein the first and third stages are transistors, means for applying an input signal to the base of said first transistor amplifier stage, a tunnel diode, said tunnel diode being the intermediate stage of said three stage amplifier, means connecting the anode and cathode electrodes of said tunnel diode to the emitter electrodes of said transistors for biasing said tunnel diode to an intermediate point on a negative resistance portion of the characteristic curve by the difference in the emitter direct current potentials of said transistors, capacitor means between the output of said first transistor stage and one of the electrodes of said tunnel diode for applying a signal to be logarithmically compressed to said tunnel diode, and means connected to the other electrode of said tunnel diode for placing said other electrode at alternating current ground potential so that said tunnel diode is operated in the parallel amplifier configuration and is a signal-level responsive load on said first transistor stage, the biasing potentials from the emitter electrodes of said transistor stage on the electrode of said tunnel diode varying in the same direction and agree as each other so that the direct current biasing voltage on said tunnel diode remains substantially constant whereby each amplitude excursion of the signal applied to said tunnel diode is instantaneously modified by said tunnel diode.

2. A logarithmic amplitude compressor as defined in claim 1 wherein said tunnel diode is an intermediate stage of a three-stage amplifier and wherein the first and third stages thereof are transistors, the said low impedance voltage source comprising the difference in emitter direct current potentials of said transistors, and the said means for applying a signal comprises a capacitor between the output of the first transistor stage and said one electrode.

3. A logarithmic amplitude compressor as defined in claim 1 including means for adjusting the direct current flowing through the emitter of one of said transistors to shift the bias on said tunnel diode and its point of operation on the negative resistance portion of its characteristic curve.

4. A logarithmic amplitude compressor as defined in claim 3 wherein said means for adjusting comprises means for adjusting direct current base biasing potential on one of said transistor amplifiers.

5. A logarithmic amplitude compressor as defined in claim 1 wherein said means for applying a signal to said tunnel diode is a capacitance coupling from a transistor amplifier and wherein said low impedance direct voltage is derived at least in part from the emitter direct current potential thereof.

6. A logarithmic amplitude compressor as defined in claim 1 further including said first transistor amplifier stage having a first resistor in the emitter circuit thereof, said second transistor amplifier stage having a second resistor in the emitter circuit thereof, said capacitance means being between the collector electrode of said first transistor stage and said one electrode of said tunnel diode constituting the said means for applying a signal to one of the electrodes of said tunnel diode, and means biasing said transistor amplifiers stage so that under no signal conditions the direct current voltages on the emitter electrodes thereof bias said tunnel diode to said intermediate operating point on the negative resistance portion of its characteristic curve.

7. A logarithmic amplitude compressor as defined in claim 6 including a signal blocking inductance element connected between said one electrode of said tunnel diode and the emitter of the transistor amplifier to which said one electrode is connected.

8. A logarithmic amplifier as defined in claim 6 including signal bypassing capacitors at the emitter electrodes of said transistor amplifiers, and a signal blocking inductance element connected between said one electrode of said tunnel diode and the emitter electrode of the transistor amplifier to which said one electrode is connected.

References Cited

UNITED STATES PATENTS

| | | | |
|---|---|---|---|
| 2,975,370 | 10/1956 | Moseley | 328—209 |
| 3,127,574 | 7/1959 | Sommers | 331—107 |
| 3,148,332 | 10/1959 | Theriault | 307—322 |
| 3,162,771 | 6/1961 | Hilsenrath | 307—258 |
| 3,212,022 | 10/1965 | Tadama | 307—322 |
| 3,218,573 | 11/1965 | Van Kessel | 307—322 |
| 3,281,610 | 10/1966 | Barbier | 307—322 |
| 3,361,975 | 1/1968 | Rorden | 333—14 |

JOHN S. HEYMAN, Primary Examiner

H. A. DIXON, Assistant Examiner

U.S. Cl. X.R.

307—322; 328—145; 333—14

UNITED STATES PATENT OFFICE
CERTIFICATE OF CORRECTION

Patent No. 3,479,525 November 18, 1969

Jack R. Harford

It is certified that error appears in the above identified patent and that said Letters Patent are hereby corrected as shown below:

Column 3, line 70, "agree" should read -- degree --. Column 4, line 1, beginning with "2. A" cancel all to and includin "electrode." in line 10; line 21, beginning with "5. A" cancel all to and including "thereof." in line 26; same column 4, the claims numbered "3, 4, 6, 7 and 8" should be renumbered -- 2, 3, 4, 5 and 6 --. In the heading to the printed specification, line 8, "8 Claims" should read -- 6 Claims --.

Signed and sealed this 15th day of September 1970.

(SEAL)
Attest:

Edward M. Fletcher, Jr.
Attesting Officer

WILLIAM E. SCHUYLER, JR.
Commissioner of Patents